United States Patent
Kamikawa et al.

(10) Patent No.: US 6,318,386 B1
(45) Date of Patent: Nov. 20, 2001

(54) TREATMENT APPARATUS

(75) Inventors: Yuji Kamikawa, Koshi-machi; Naoki Shindo, Kurume; Shigenori Kitahara, Chikugo, all of (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/546,291

(22) Filed: Apr. 10, 2000

Related U.S. Application Data

(62) Division of application No. 09/156,754, filed on Sep. 16, 1998, now Pat. No. 6,082,381.

(30) Foreign Application Priority Data

Sep. 17, 1997 (JP) .................................................. 9-269213

(51) Int. Cl.⁷ .................................................. B08B 13/00
(52) U.S. Cl. .......................................... 134/99.2; 134/902
(58) Field of Search .................................. 134/902, 95.1, 134/98.1, 99.2, 100.1

(56) References Cited

U.S. PATENT DOCUMENTS

| | | | |
|---|---|---|---|
| 2,592,885 | * 4/1952 | Fox et al. ........................ | 134/98.1 X |
| 2,619,107 | * 11/1952 | Graham . | |
| 4,892,112 | * 1/1990 | Knetsch ........................... | 134/102.1 |
| 5,383,481 | * 1/1995 | Waelput .......................... | 134/98.1 X |
| 5,520,744 | * 5/1996 | Fujikawa et al. .............. | 134/102.3 X |
| 5,922,138 | * 7/1999 | Shindo et al. ................... | 134/902 X |
| 5,993,174 | * 11/1999 | Konishi ........................... | 417/413.1 |

* cited by examiner

Primary Examiner—Philip R. Coe
(74) Attorney, Agent, or Firm—Morrison & Foerster LLP

(57) ABSTRACT

A cleaning tank 30 stores a cleaning liquid to clean the surfaces of semiconductor wafers W immersed in the cleaning liquid. A cleaning liquid supply pipe 33 connects the cleaning tank 30 to a pure water supply source 31. A chemical liquid container 34 stores a chemical liquid, and a chemical liquid supply pipe 36 connects the cleaning liquid supply pipe 33 to the chemical liquid container 34 via an infusion open/close switching valve 35, and a chemical liquid feed means is interposed in the chemical liquid supply pipe 36. The chemical liquid feed means is a reciprocal pump, such as diaphragm pump 37. Thus, a predetermined quantity of the chemical liquid can be infused into pure water or to a drying gas generator to ensure that the chemical liquid of a predetermined concentration be available for washing or drying treatment, regardless of fluctuations in flow amount or pressure of pure water or a drying gas carrier gas.

4 Claims, 11 Drawing Sheets

TREATMENT APPARATUS

This is a division of U.S. application Ser. No. 09/156,754 filed Sep. 16, 1998, and now Pat. No. 6,082,381.

BACKGROUND OF THE INVENTION

1. Field of the Invention

This invention relates to a treatment apparatus for cleaning or drying semiconductor wafers, LCD glass substrates, or other objects to be treated, for example.

2. Description of the Prior Art

In the field of semiconductors, in general, there are widely employed various treatment apparatuses, such as cleaning apparatuses for cleaning semiconductor wafers, LCD glass substrates, or other objects to be processed (hereinafter called wafers, etc.) by sequentially immersing them in a cleaning vessel or other treatment portion storing a chemical liquid, such as ammonia water ($NH_4OH$) or hydrofluoric acid (HF), cleaning liquid, such as rinsing liquid (pure water), and drying apparatuses for drying wafers, etc. which have been cleaned.

A widely used conventional cleaning apparatus of this type includes a cleaning vessel or other treatment means which store a cleaning liquid to immerse wafers, etc. into the cleaning agent to clean their surfaces; a cleaning liquid supply pipe connecting the cleaning vessel to a pure water supply source; and a chemical liquid reservoir storing a chemical liquid and connected to the cleaning liquid supply pipe, so as to infuse the chemical liquid to the pure water flowing through the cleaning liquid supply pipe with the aid of a compressed carrier gas, such as nitrogen ($N_2$) gas, into the chemical liquid in the chemical liquid reservoir so that the chemical liquid of a predetermined concentration be supplied into the cleaning vessel and used for cleaning objects to be processed.

A widely used conventional drying apparatus includes a drying chamber or other treatment portion for applying a drying gas onto wafers, etc. to dry them; a $N_2$ gas supply pipe connecting the drying chamber to a supply source of a drying gas carrier gas, such as $N_2$ gas,; a chemical liquid container storing a chemical liquid such as IPA (isopropyl alcohol) or other organic solvent; and a drying gas generator interposed in the N2 gas supply pipe, so as to compress IPA in the chemical liquid container with the $N_2$ gas or other carrier gas and to infuse it to the drying gas generator, such that the drying gas of a predetermined concentration be supplied into the drying chamber and used to dry objects to be processed.

However, since these conventional treatment apparatuses were configured to compress a chemical liquid stored in the chemical liquid container by using a pressurized inert gas such as $N_2$ gas, and to inject the chemical liquid into a pure water line or the dryer gas generator, the supplied amount of the chemical liquid was liable to vary with changes in flow rate of pure water or dryer gas or with changes in pressure. It inevitably caused fluctuation in concentration of the chemical liquid in the pure water or in the drying gas, a decrease in cleaning efficiency or drying efficiency, and a decrease in manufacturing yield.

SUMMARY OF THE INVENTION

It is therefore an object of the invention to provide a treatment apparatus in which an accurate quantity of a chemical liquid is infused into pure water or a drying gas generator irrespectively of changes in flow amount or pressure of a treatment medium such as pure water, drying gas carrier gas, etc., such that the chemical liquid or drying gas of a predetermined concentration be available for cleaning or drying treatment.

According to the invention, there is provided a treatment apparatus comprising: a treatment section storing a cleaning liquid, for cleaning a surface of an object to be treated immersed into the cleaning liquid; a pure water supply pipe; a supply pipe connecting the treatment section and the pure water supply source; a chemical liquid container storing a chemical liquid; a chemical liquid supply pipe connecting the supply pipe to the chemical liquid container via open/close switching means; and chemical liquid feed means provided in the chemical liquid supply pipe, the chemical liquid feed means being a positive displacement pump.

By using the positive displacement pump, an accurate quantity of the chemical liquid can be infused into pure water independently from changes in flow amount or pressure of the pure water flowing through the supply pipe to ensure that the chemical liquid of a predetermined concentration can be supplied to the treatment section. Therefore, the cleaning efficiency is improved, and the production yield can be improved.

The positive displacement pump may be a reciprocally driven pump, and a circulating conduit may be connected between a portion of the chemical liquid supply pipe near a chemical liquid outlet of the chemical liquid supply means and the chemical liquid container. An open/close means and a filter may be interposed in the circulating conduit.

In this manner, the chemical liquid, currently out of use, can be always circulated and filtered to smoothly supply the chemical liquid and to stabilize the supplied quantity of the chemical liquid.

According to the invention, there is further provided a treatment apparatus comprising: a treatment section for drying an object to be treated by supplying a drying gas into contact therewith; a supply source of a drying gas carrier gas; a supply pipe connecting the treatment section and the supply source of a drying gas carrier gas; a chemical liquid container storing a chemical liquid; a drying gas generator provided in the supply pipe; a chemical liquid supply pipe connecting the drying gas generator and the chemical liquid container; and chemical liquid feed means provided in the chemical liquid feed pipe, the chemical liquid feed means being a positive displacement pump.

In this manner, an accurate quantity of the chemical liquid can be infused (mixed) into the carrier gas independently from changes in flow rate or pressure of the carrier gas supplied to the drying gas generator to ensure that the chemical liquid of a predetermined concentration can be supplied to the treatment portion. Therefore, the drying efficiency is improved, and the production yield can be improved.

A filter may be provided in the chemical liquid supply pipe in a location near a chemical liquid outlet of the chemical liquid supply means.

In this manner, the chemical liquid can be filtered just before infusion to remove particles or other impurities from the chemical liquid.

The positive displacement pump may be a reciprocally driven pump in the form of an air-pressurized diaphragm pump having one diaphragm or a plurality of interlinked diaphragms, and the treatment apparatus may further comprise air pressure adjusting means and channel open/close switching means interposed in an air supply pipe connecting a driving portion of the diaphragm pump to a driving air supply source. The channel open/close switching means is controllable in switching speed.

In this manner, an accurate quantity of the chemical liquid can be infused reliably into the pure water or to the drying gas generator to facilitate adjustment of the concentration of the chemical liquid.

The reciprocally driven pump may be one electrically driven bellows pump or a plurality of electrically driven bellows pumps communicating with each other. In this case a ball screw may be used as means for driving the bellows pump.

In this manner, an accurate quantity of the chemical liquid can be infused reliably into the pure water or to the drying gas generator, and the chemical liquid can be infused continuously by elongating the strokes of the bellows pumps.

The reciprocally driven pump may be a plurality of electrically driven bellows pumps communicating with each other and driven in different phases from each other.

In this manner, the chemical liquid can be infused continuously by diving one of the bellows pumps for the suction stroke and the other for the discharge stroke.

Pressure detecting means may be provided near an outlet of the reciprocally driven pump to issue a detection signal used to control a driving portion of the reciprocally driven pump so as to regulate the quantity of the chemical liquid to be discharged.

In this manner, the infused amount of the chemical liquid can be monitored to ensure that an appropriate quantity of the chemical liquid can be infused into pure water or to the drying gas generator.

The treatment section may include an inner tank for immersing the object to be treated and an outer tank covering an outer circumference of an open end of the inner tank, and a circulating conduit connects the bottom of the outer tank to a cleaning liquid supply portion provided in the inner tank. A circulating pump, a temperature adjusting mechanism and a filter are may be interposed in the circulating conduit.

In this manner, the chemical liquid stored in the treatment section can be adjusted in temperature and circularly supplied through filtration. This contributes to reducing the consumption of the chemical liquid and to more efficiently using the chemical liquid.

Pulsation buffering means may be interposed in the chemical liquid supply pipe near an outlet of the chemical liquid supply means.

In this manner, the intermittent waveform of the chemical liquid discharged from the chemical liquid supply means can be modified into a continuous waveform to ensure that the chemical liquid be more smoothly infused into pure water or to the drying gas generator.

DESCRIPTION OF THE PREFERRED EMBODIMENTS

Some embodiments of the invention will be described below with reference to the drawings, the embodiments being explained as being applied to cleaning treatment systems for semiconductor wafers.

Figure 1:
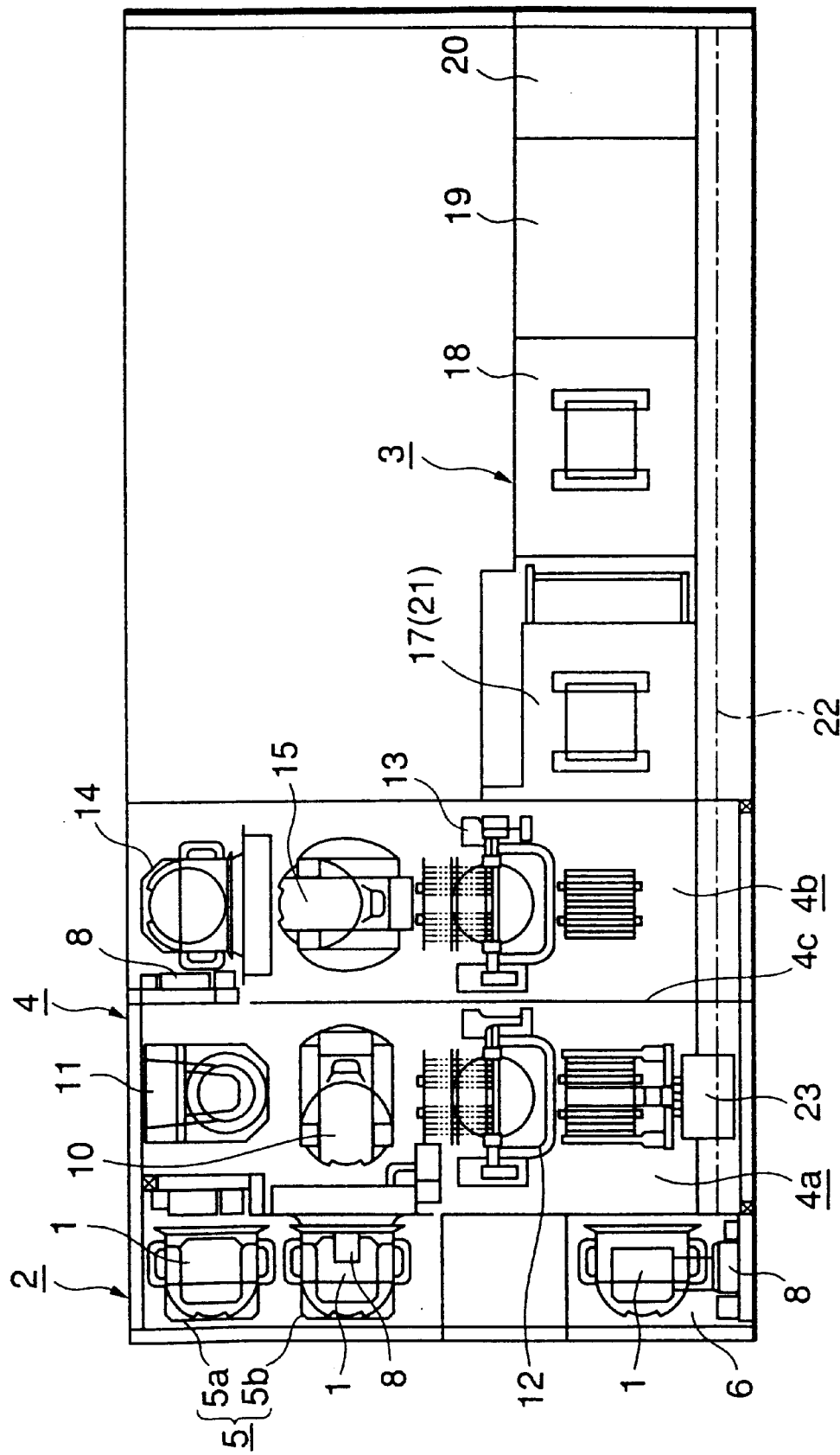
FIG. 1 is a general plan view of a cleaning treatment system to which the treatment apparatus according to the invention is applied.
Figure 2:
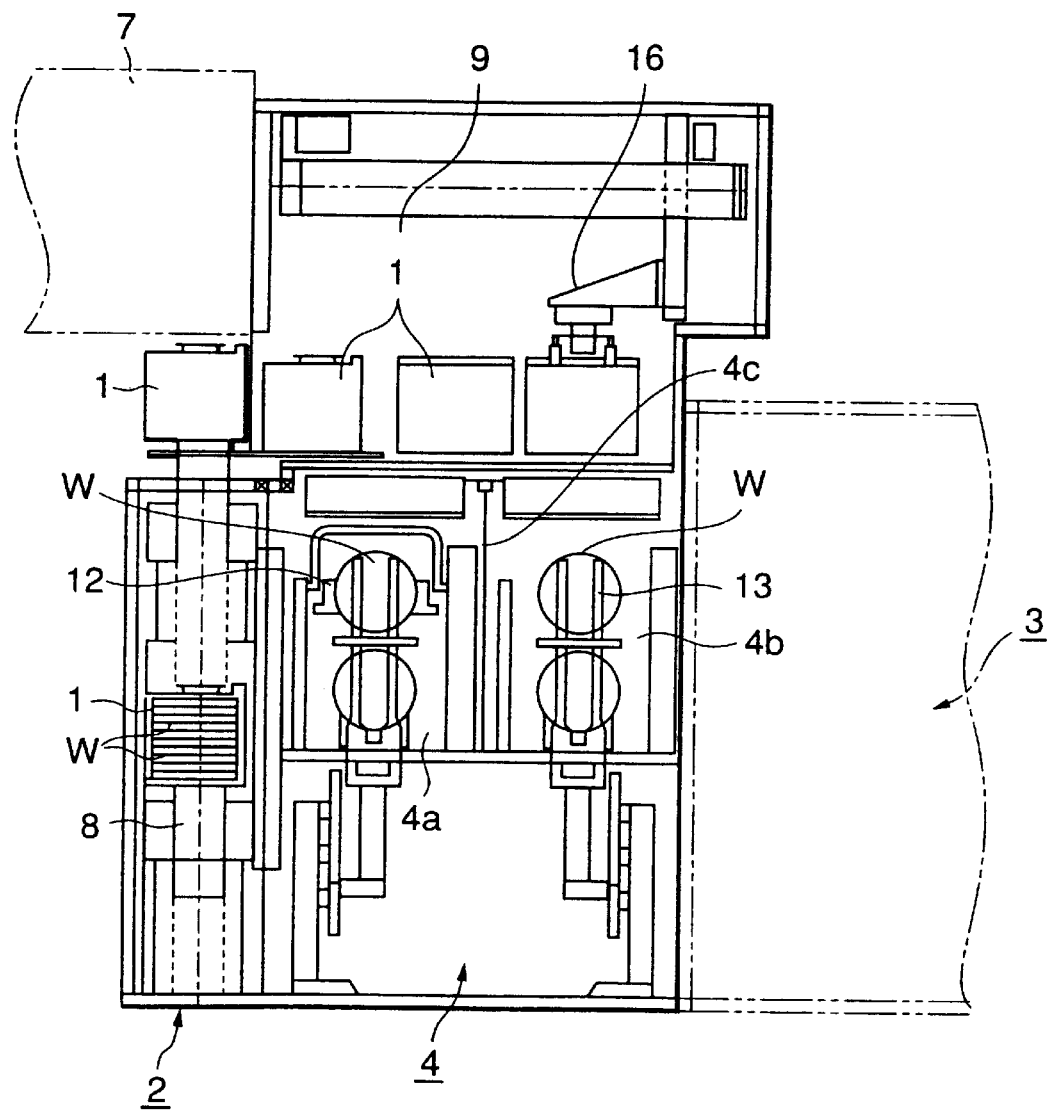
FIG. 2 is a general side-elevational view of a part of the cleaning treatment system of FIG. 1.

FIG. 1 is a general plan view of a cleaning treatment system to which a cleaning treatment apparatus according to the invention is applied. FIG. 2 shows a side-elevational view of a part of the system shovel in FIG. 1.

The cleaning treatment system mainly includes a transport section 2 for receiving or delivering a carrier 1, or any other appropriate container, configured to store semiconductor wafers W to be treated (hereinafter called wafers) in a horizontal posture; a cleaning/drying treatment section 3 for treating wafers W with a liquid, such as cleaning liquid, and for drying them; an interface section 4 interposed between the transport section 2 and the cleaning/drying treatment section 3 to exchange wafers W, adjust their positions, change their postures, and so on.

The transport section 2 includes an inlet part 5 and an outlet part 6 which are aligned along one end of the cleaning treatment system. The inlet part 5 has a receiver portion 5a for receiving the carrier 1 from an upper transport mechanism 7 and a delivery portion 5b for supporting the carrier 1 transported from the receiver portion 5a horizontally. In the delivery portion 5b, a carrier lifter 8 is provided to transport the carrier 1 between an upper position and an inlet opening (not shown) of the interface section 4. In the outlet part 6, another carrier lifter 8 is provided to transport the carrier 1 between an outlet opening (not shown) of the interface portion 4 and an upper position. The carrier 1 can be transported to and from the inlet part 5 or the outlet part 6, and an empty carrier 1 can be delivered to or received from a carrier waiting section 9 located above the interface section 4 by these carrier lifters 8 (see FIG. 2).

The interface section 4 is divided by a partition 4c into a first chamber 4a adjacent to the transport section 2 and a second chamber 4b adjacent to the cleaning/drying treatment section 3. Provided in the first chamber 4a are a wafer pickup arm 10 movable in horizontal (X and Y) directions, vertical (Z) direction and rotational (θ) direction to pick up and transport a plurality of wafers W from the carrier 1 in the inlet part 5 (more specifically, the delivery portion 5b); a notch aligner 11 for aligning notches formed in the wafers W; and a space adjusting mechanism (not shown) for adjusting spaces between wafers W picked up by the wafer pickup arm 10. Also a first re-posturing device 12 is provided in the first chamber 4a to re-posture the wafers from a horizontal orientation into a vertical orientation.

Provided in the second chamber 4b are a second re-posturing device 13 and a wafer storage arm 15. The second re-posturing device 13 receives wafers W from a wafer transport chuck 23, which transport vertically-oriented wafers W after treatment from the cleaning/drying treatment section 3, and change the posture of the wafers from the vertical status into a horizontal status. The wafer storage arm 15 is movable in horizontal (X and Y) directions, vertical (Z) direction and rotational (θ) direction to receive wafers W in the horizontal status from the second re-posturing device 13 and to stack them in an empty carrier 1 transported to a wafer receiver portion 14. In the wafer receiver portion 14, a carrier lifter 8 is provided to transport the carrier between the wafer receiver portion 14 and the carrier waiting section 9. In the carrier waiting section 9, a carrier transport robot 16 for moving an empty carrier 1 after delivering wafers W in the wafer receiver portion 5b or a carrier 1 containing wafers W stacked in the wafer receiver portion 14 to a predetermined waiting position, or to move a carrier 1 transported from the wafer receiver portion 14 to the carrier waiting section 9 and containing wafers W to a position above the outlet part 6.

The cleaning/drying treatment section 3 includes a first treatment unit 19 for removing particles or organic contaminants from the wafers W, a second treatment unit 18 for removing metallic contaminants from the wafers, a third treatment unit 17 for removing oxide films from the wafers W, and a chuck cleaning unit 20, which are aligned linearly. Additionally, a drying treatment unit 21 is provided above the third treatment unit 17. In this case, the present invention is applied to the third treatment unit 17 or the drying treatment unit 21. Further provided is a wafer transport chuck 23 movable in X and Y (horizontal) directions, Z (vertical) direction and rotational (θ) direction on a transport path 22 extending from the position adjacent to the units 17 through 20 to the interface section 4.

The cleaning treatment apparatus according to the invention will now be described.

First Embodiment

Figure 3:
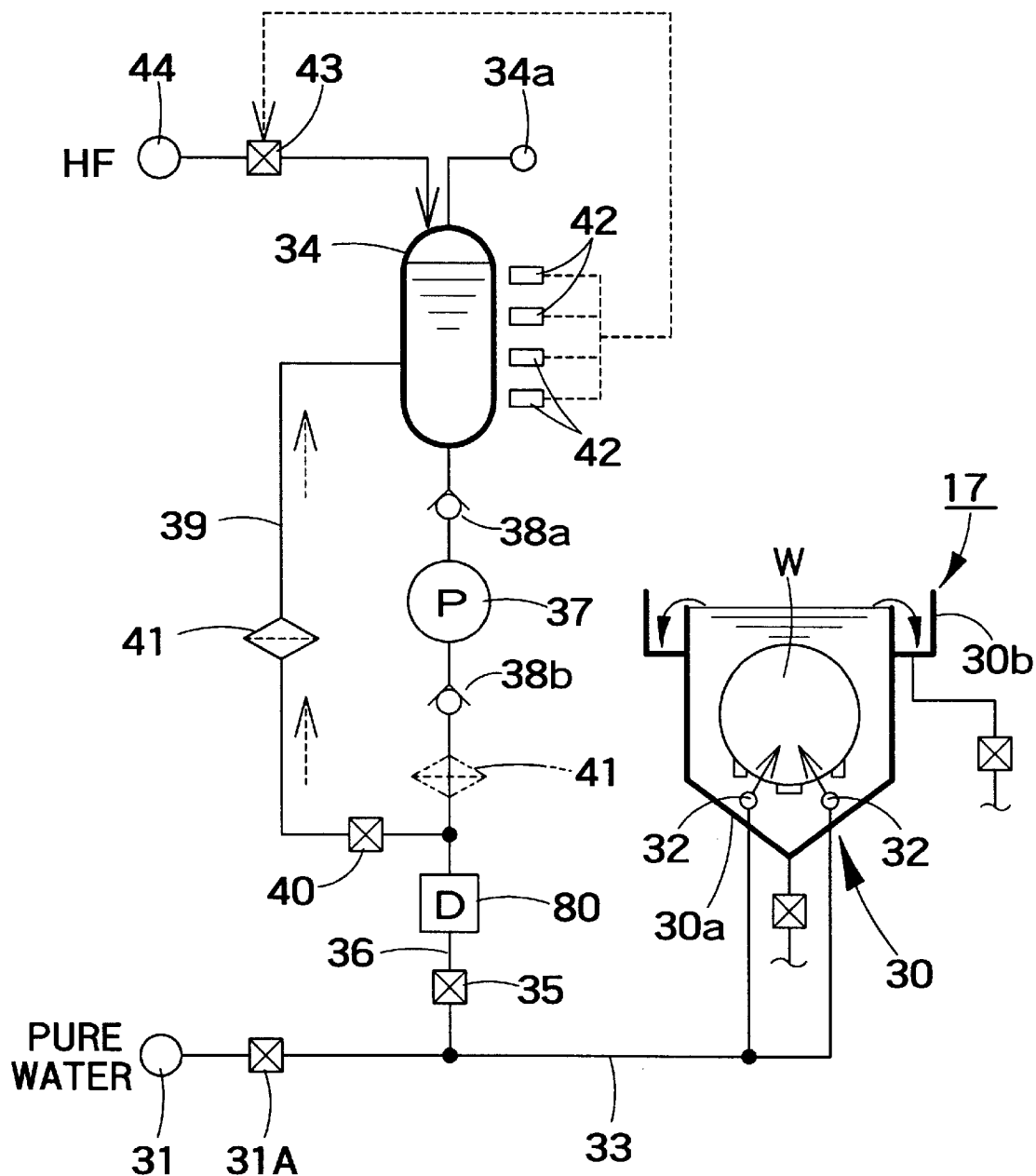
FIG. 3 is a schematic sectional view showing a treatment apparatus according to a first embodiment of the invention.

FIG. 3 is a sectional view schematically showing a treatment apparatus taken as a first embodiment of the invention.

The treatment apparatus 17 includes a treatment portion 30, e.g. a cleaning tank, for storing a chemical liquid, such as diluted hydrofluoric acid (DHF), or a rinsing or cleaning liquid, such as pure water, to immerse objects to be treated, such as semiconductor wafers W (hereinafter called wafers) and clean their surfaces; a cleaning liquid supply pipe 33 connecting a cleaning liquid supply nozzle 32 in the cleaning tank 30 to the a pure water supply source 31 to connect the cleaning tank 30 and the pure water supply source 31; a chemical liquid container 34 storing a chemical liquid such as hydrofluoric acid (HF); a chemical liquid supply pipe 36 connecting the cleaning liquid supply pipe 33 and the chemical liquid container 34 via an open/close switching valve (open/close switching means) 35; and a chemical liquid supply means such as reciprocal pump 37, as an example of a positive displacement pump, interposed in the chemical liquid supply pipe 36. An open/close valve 31A is provided in the cleaning liquid supply pipe 33 at a position near the outlet end of the pure water supply source 31.

Also in the chemical liquid supply pipe 36, check valves 38a and 38b are interposed at positions on the suction side and the discharge side of the reciprocal pump 37. A circulation conduit 39 connected to the chemical liquid container 34 is connected to the chemical liquid supply pipe 36 at a location on the discharge side of the reciprocal pump 37. Interposed in the circulating conduit 39 are an open/close valve 40 and a filter 41 from the pump discharge side toward the chemical liquid container 34. By connecting the pump discharge side and the chemical liquid container 34 with the circulation conduit 39 and interposing the open/close valve 40 and the filter 41 in the circulation conduit 39, the chemical liquid, such as HF, stored in the chemical liquid container 34 can be filtered and circulated through the circulation conduit 39 during intermission in which infusion of the chemical liquid into pure water is stopped. Therefore, the liquid, currently out of use, can be always circulated and filtered to smooth the next infusion of the chemical liquid and to stabilize its quantity to be infused.

The filter 41 may be interposed in the chemical liquid supply pipe 36 at a location on the discharge side of the pump 37 as shown with the imaginary line in FIG. 3. In this case, in addition to the behavior of always circulating and filtering the chemical liquid out of use to smooth the next infusion of the chemical liquid and to stabilize its quantity to be infused, it is also possible to remove any particles from the chemical liquid when it is infused.

Provided outside the chemical liquid container 34 are level sensors 42 for detecting the level of the surface of the chemical liquid in the container 34. A signal detected by the level sensor 42 is transmitted to a control means (not shown) which responsively supplies a control signal to open a chemical liquid supply open/close valve 43 and to supply the chemical liquid from the chemical liquid supply source 44 to the container 34. The chemical liquid container 34 has formed with an air vent hole which communicates with an air release portion 34a.

A damper 80 as a pulsation buffering means is interposed in the chemical liquid supply pipe 36 at a location on the pump discharge side to change the flow rate waveform of the chemical liquid intermittently discharged from the reciprocal pump 37 into a continuous waveform so that the chemical liquid be smoothly infused into pure water.

Figure 4:
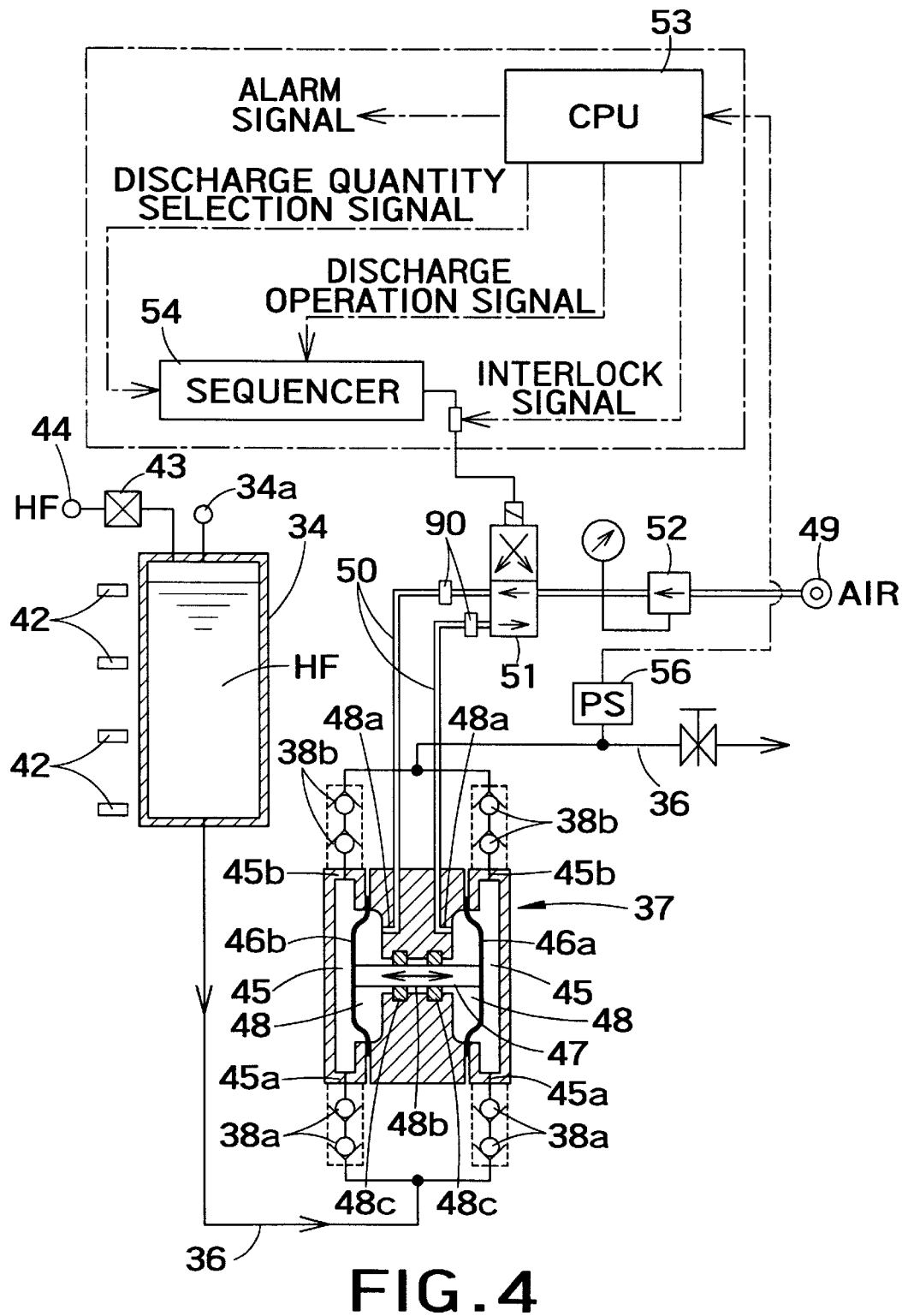
FIG. 4 is a schematic sectional view showing a central part of the first embodiment.

With reference to FIG. 4, the reciprocal pump 37 may be a reciprocally driven diaphragm pump having two paths 45 extending between two suction ports 45a connected to the chemical liquid container 34 and two discharge ports 45b connected to the cleaning liquid supply pipe 33, respectively; a pair of diaphragms 46a, 46b coupled by a coupling rod 47 to move into or retract from the paths 45; and air supply ports 48a for supplying driving air into chambers 48 divided from the paths 45 by the diaphragms 46a, 46b. The coupling rod 47 is slidably held in a through hole 48b extending between the chamber 48 through O-rings 48c.

In air supply pipes 50 connecting the air IN/OUT ports 48a to the air supply source 49, a four-port two-position switching valve 51 (hereinafter called switching valve) as a path switching means and a regulator 52 for air pressure adjustment are interposed so that driving air adjusted in pressure by the regulator 52 be supplied by switching actions of the switching valve 51 to press the diaphragms 46a, 46b. When the switching valve 51 is activated, air is supplied onto the diaphragms 46a, 46b alternately, and, by reciprocal movements of the diaphragms 46a, 46b, a predetermined amount of the chemical liquid in the chemical liquid container 34 is infused, although intermittently, into pure water flowing through the cleaning liquid supply pipe 33. In this case, the switching valve 51 is configured to behave for switching operation in response to a signal from a sequencer 54 storing control signals predetermined by a central processing unit (CPU) 53, for example, such as discharge quantity selection signal and discharge motion signal, for example. In locations of the air supply pipe 50 on outlet and inlet sides of the switching valve 51, fiber sensors 90 are interposed to detect any back-flow of the chemical liquid from the diaphragm pump 37 to the switching valve 51. The fiber sensors 90 detect the liquid when the liquid enters the fiber sensors.

Additionally, two check valves 38a, 38a; 38b, 38b are interposed in the chemical liquid supply pipe 36 at each of locations extending from the suction ports 45a and the discharge ports 45b of the diaphragm pump 37 to reliably prevent back flow of the chemical liquid during operation of the diaphragm pump 37. Also interposed in the chemical liquid supply pipe 36 is a pressure detecting sensor 56 on the discharge side of the diaphragm pump 37. A detection signal detected by the pressure detecting sensor 56 is transmitted to the CPU 53 for comparison and operation with information stored in the CPU 53, and transmitted to the sequencer 54 and as an interlocking (stop) signal directly to a driving means of the switching valve 51.

In the treatment apparatus having the above-explained construction, when the channel between the pure water supply source 31 and the cleaning tank 30 is opened by opening the open/close valve 31A and by operating the infusion open/close switching valve 35, pure water is supplied to and stored in the cleaning tank 30 from the pure water supply source 31 through the cleaning liquid supply pipe 33 and the cleaning liquid supply nozzle 32, and overflows to clean wafers W contained in the cleaning tank 30.

While pure water is permitted to flow from the pure water supply source 31, the infusion open/close switching valve 35 is opened so that the channel from the chemical liquid supply pipe 36 is opened. The the regulator 52 is activated and the switching valve 51 is activated for switching operation. As a result, driving air of a certain pressure predetermined by a simulator alternately presses the diaphragms 46a, 46b of the diaphragm pump 37. Accordingly, a quantity of the chemical liquid, such as hydrofluoric acid (HF), flows from the chemical liquid container 34 into the cleaning liquid supply pipe 33 through the chemical liquid supply pipe 36 and diluted by the pure water, and the chemical liquid, i.e. diluted hydrofluoric acid (DHF), of a predetermined concentration is supplied to the cleaning tank 30. As a result, DHF of a concentration predetermined by the simulator is stored in the cleaning tank 30, and overflows to remove particles and oxide films from surfaces of wafers W contained in the cleaning tank 3.

After treatment by the chemical liquid, the infusion open/close switching valve 35 is operated to maintain the channel from the pure water supply source 31 to the cleaning tank 30 and to close the channel from the chemical liquid supply pipe 36. As a result, pure water is supplied to the cleaning tank 30 to replace DHF with pure water. Then, wafers W can be immersed into pure water, and the chemical liquid, namely, HF, can be removed from wafers W by overflow of the pure water.

Second Embodiment

Figure 5:
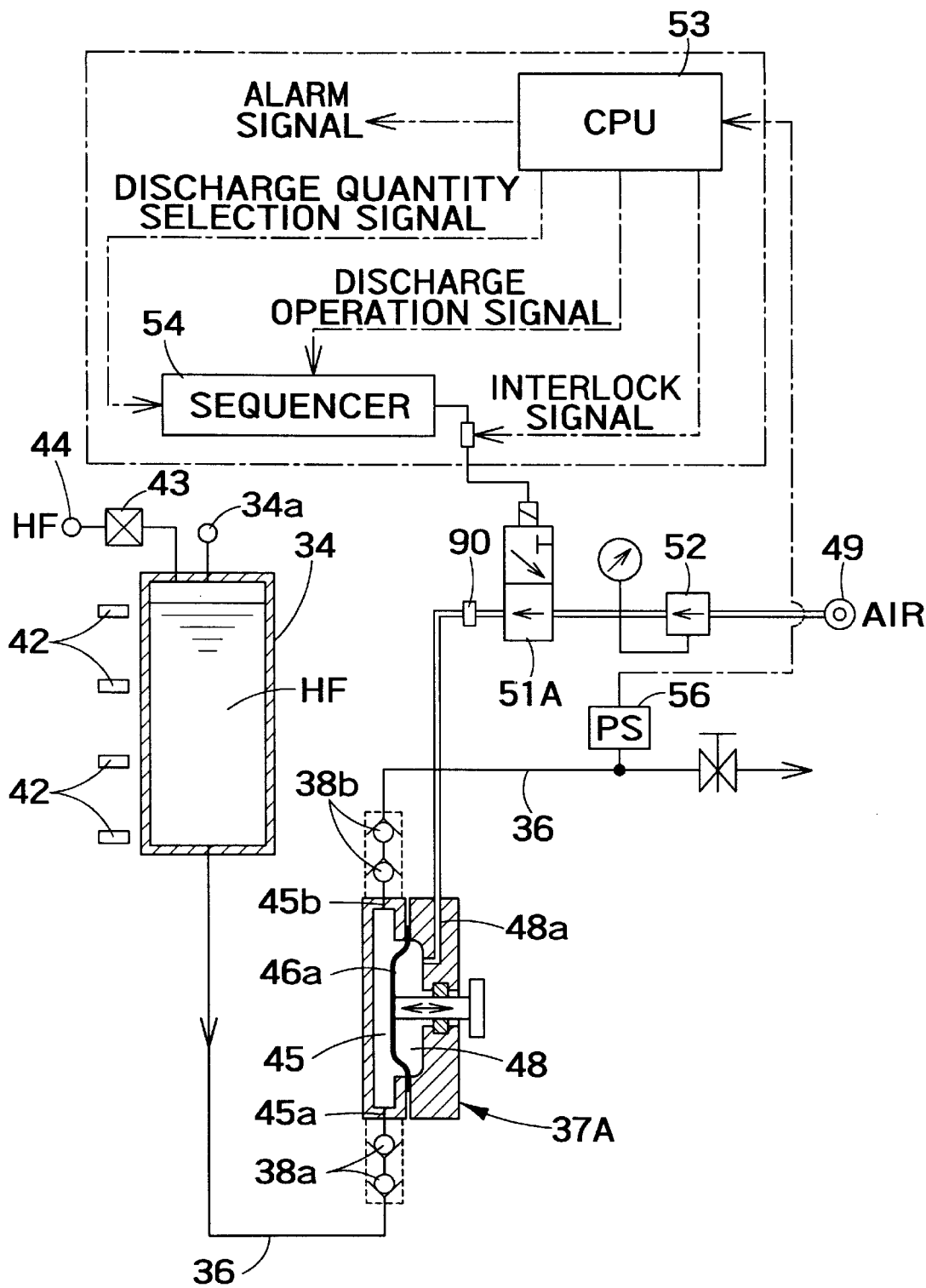
FIG. 5 is a schematic sectional view showing a central part of a treatment apparatus according to a second embodiment of the invention.

FIG. 5 is a sectional view schematically showing a treatment apparatus according to a second embodiment of the invention.

The first embodiment has been explained as using a double-acting diaphragm 37 as the reciprocal pump which is a kind of positive displacement pumps. However, the reciprocal pump may be a single-acting diaphragm pump instead of a double-acting diaphragm pump. That is, as shown in FIG. 5, the diaphragm pump may be a single-acting diaphragm pump 37A having a diaphragm 46 configured to move into or retract from a path 45 extending between the suction port 45a connected to the chemical liquid container 34 and the discharge port 45b connected to the cleaning liquid supply pipe 36, and having an air supply port 48a for supplying driving air into a chamber 48 on one side of the diaphragm 46 opposite from the path 45. In this case, a two-port two-position switching valve 51A (conduit switching means) is interposed in the air supply pipe 50.

In the other respects, the second embodiment is the same as the first embodiment. Therefore, the same elements are labeled with common reference numerals, and their explanation is omitted here.

Third Embodiment

Figures 6A, 6B:
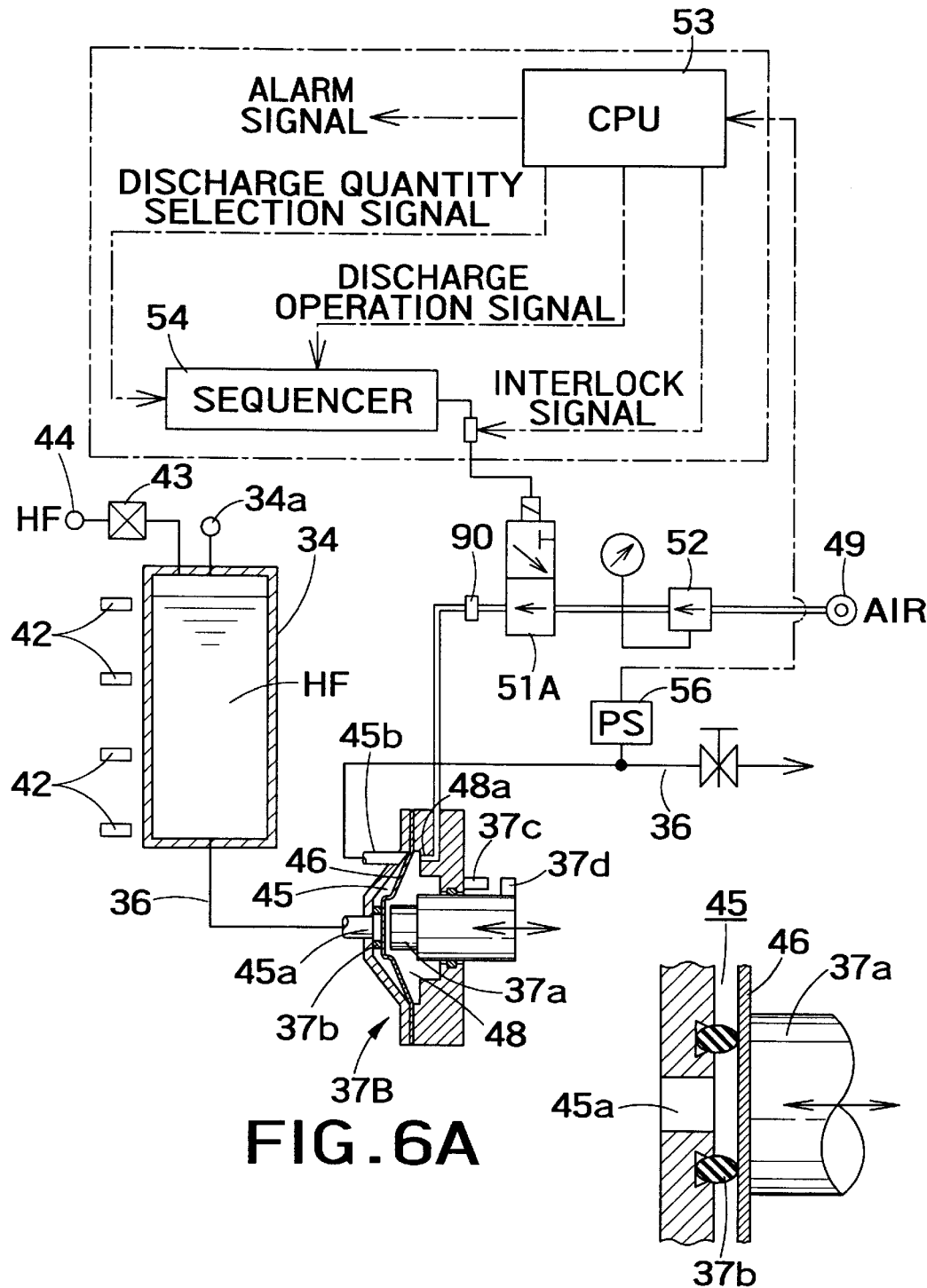
FIG. 6A is a schematic sectional view of a treatment apparatus according to a third embodiment of the invention.
FIG. 6B is a sectional view showing a central part thereof on an enlarged scale.

FIG. 6A is a sectional view of a treatment apparatus according to a third embodiment of the invention, and FIG. 6B is a sectional view showing a central part of the apparatus on an enlarged scale.

The third embodiment is a version with a measure for reducing the inertial flow during operation of the reciprocal pump. That is, as shown in FIG. 6A, the suction port 45a of the reciprocal pump, which may be a diaphragm pump 37B, is oriented toward the plane of the diaphragm 46, and, as shown in FIG. 6B, an O-ring 37b is mounted to widely encircle the suction port 45a, so that a pump shaft 37a reciprocated by air pressure tightly presses the diaphragm 46 onto the O-ring 37b to finish a supply of the chemical liquid and to close the path 45. In this case, an adjustable stroke limitter 37c attached to the main body of the diaphragm pump 37B is engageable with a stopper projection 37d formed on the pump shaft 37a to adjust the discharge quantity.

Since a back pressure can be applied to the discharge side by tightly pressing the diaphragm 46 directly onto the O-ring 37b around the suction port 4a to thereby close the path 45, the inertial flow can be prevented, and the discharge accuracy of the diaphragm pump 37B can be improved. The initial flow pertains to a phenomenon where, as the discharged flow amount from the pump increases, the inertial force of the chemical liquid itself discharged from the pump chamber increases and the flow of the discharged liquid does not stop even after the diaphragm 46 stops.

Although the above explanation is made as using a single-acting diaphragm pump, it is applicable also to the double-acting diaphragm pump used in the first embodiment. In the other respects, the third embodiment is the same as the first and second embodiments. Therefore, the same elements are labeled with common reference numerals, and their explanation is omitted here.

Fourth Embodiment

Figure 7:
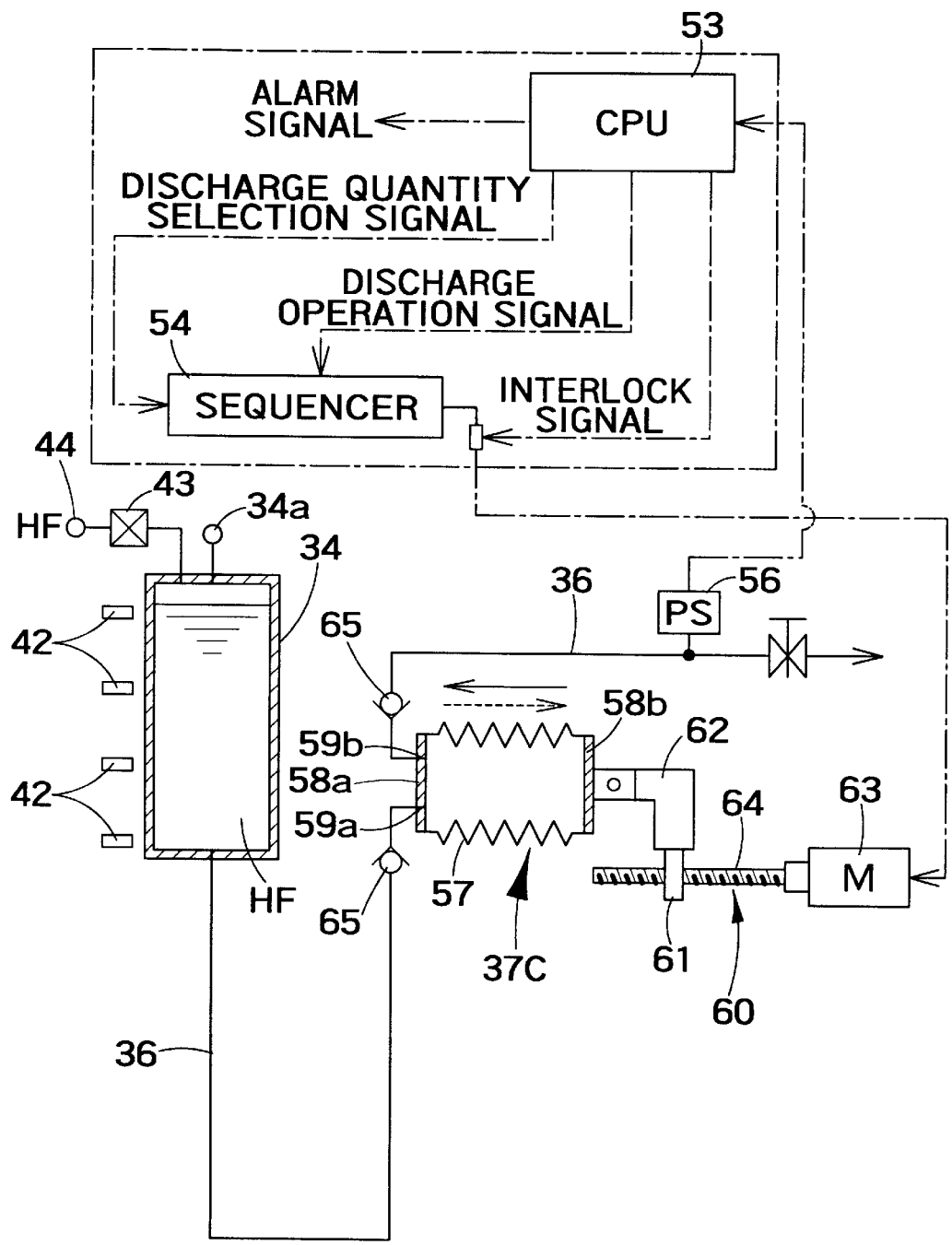
FIG. 7 is a schematic sectional view showing a central part of a treatment apparatus according to a fourth embodiment of the invention.

The fourth embodiment is a version using an electric bellows pump 37C as the reciprocal pump. That is, as shown in FIG. 7, a suction port 59a connected to the chemical liquid supply pipe 36 toward the chemical liquid container 34 and a discharge port 59b connected to the chemical liquid supply pipe 36 toward the cleaning liquid supply pipe 33 are provided in a side wall 58a fixed to one end of a bellows 57. An operating member 62 connected to a movable member 61 of a ball screw mechanism 60 is connected to a movable wall 58b fixed to the other end of the bellows 57 to rotate a screw shaft 64 by forward and reverse rotations of a motor 63 of the ball screw mechanism 60 and to move the movable wall 58b via the movable member 61 and the operating member 62 so that a quantity of the chemical liquid be infused into pure water.

In this case, check valves 65 are interposed in the chemical liquid supply pipe 36 in locations extending from the suction port 59a and discharge port 59b of the bellows pump 37B, respectively, and a pressure detecting sensor 56 is interposed in the chemical liquid supply pipe 36 in a location on the discharge side. A detection signal detected by the pressure detecting sensor 56 is transmitted to a CPU 53 for comparison and operation with information stored in the CPU 53. Then, the signal is transmitted to the sequencer 54, then to the motor 63 of the ball screw mechanism 60, and transmitted as a hardware interlocking (stop) signal directly to the motor 63 of the ball screw mechanism 60, in case of an emergency.

In the other respects, the fourth embodiment is the same as the first through third embodiments. Therefore, the same elements are labeled with common reference numerals, and their explanation is omitted here.

The treatment apparatus according to the fourth embodiment can infuse a predetermined quantity of the chemical liquid into pure water by rotating the motor 63 at a predetermined rotational speed in forward and reverse directions in response to the operation signal from the sequencer 54 which stores control signals (discharge quantity selecting signal, discharge motion signal) predetermined by the CPU 53. Therefore, the quantity and time of infusion of the chemical liquid for each stroke can be increased as compared with the diaphragm pumps according to the first to third embodiments.

Fifth Embodiment

Figure 8:
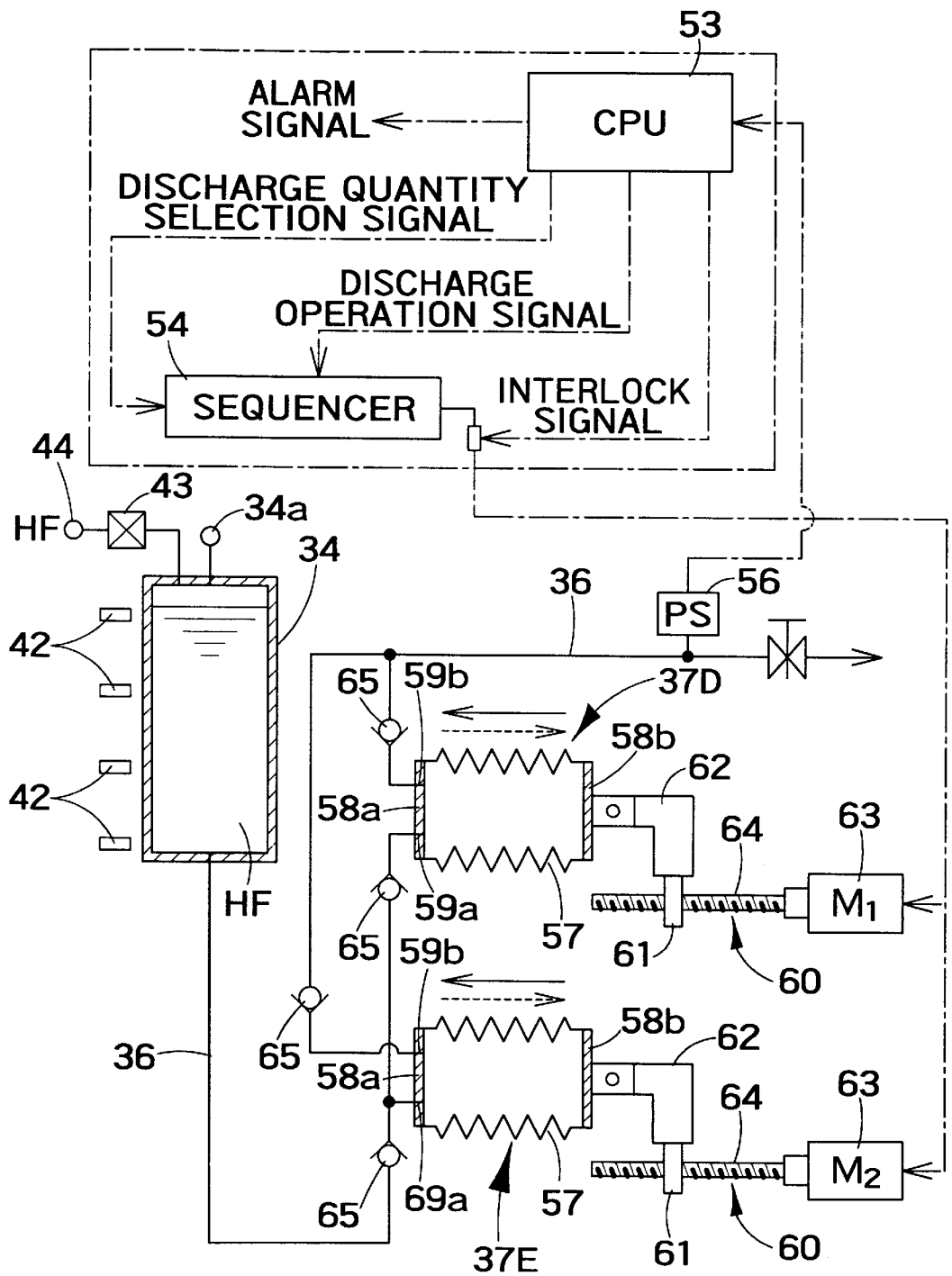
FIG. 8 is a schematic sectional view showing a central part of a treatment apparatus according to a fifth embodiment of the invention.

FIG. 8 is a general sectional view of a treatment apparatus according to a fifth embodiment of the invention.

While the fourth embodiment has been explained as using one bellows pump 37C to infuse a quantity of the chemical liquid from the chemical liquid container 34 into pure water flowing through the cleaning liquid supply pipe 33, a plurality of bellows pumps (two bellows pumps in FIG. 8) 37D, 37E may be provided in parallel alignment and in communication with each other. In this case, by inverting inclinations of the screw shafts 64 of the ball screw mechanisms 60 of the bellows pumps 37D and 37E from each other, a phase difference can be made in operation of the bellows pumps 36D and 37E. That is, the bellows pumps may be so configured that, while one of them, 37D, is in the stroke for discharging the chemical liquid, the other 37E be in the suction stroke. Thus, by driving the bellows pumps 37D, 37E alternately, the chemical liquid can be infused continuously.

In the other respects, the fifth embodiment is the same as the first to fourth embodiments. Therefore, the same elements are labeled with common reference numerals, and their explanation is omitted here.

Sixth Embodiment

Figure 9:
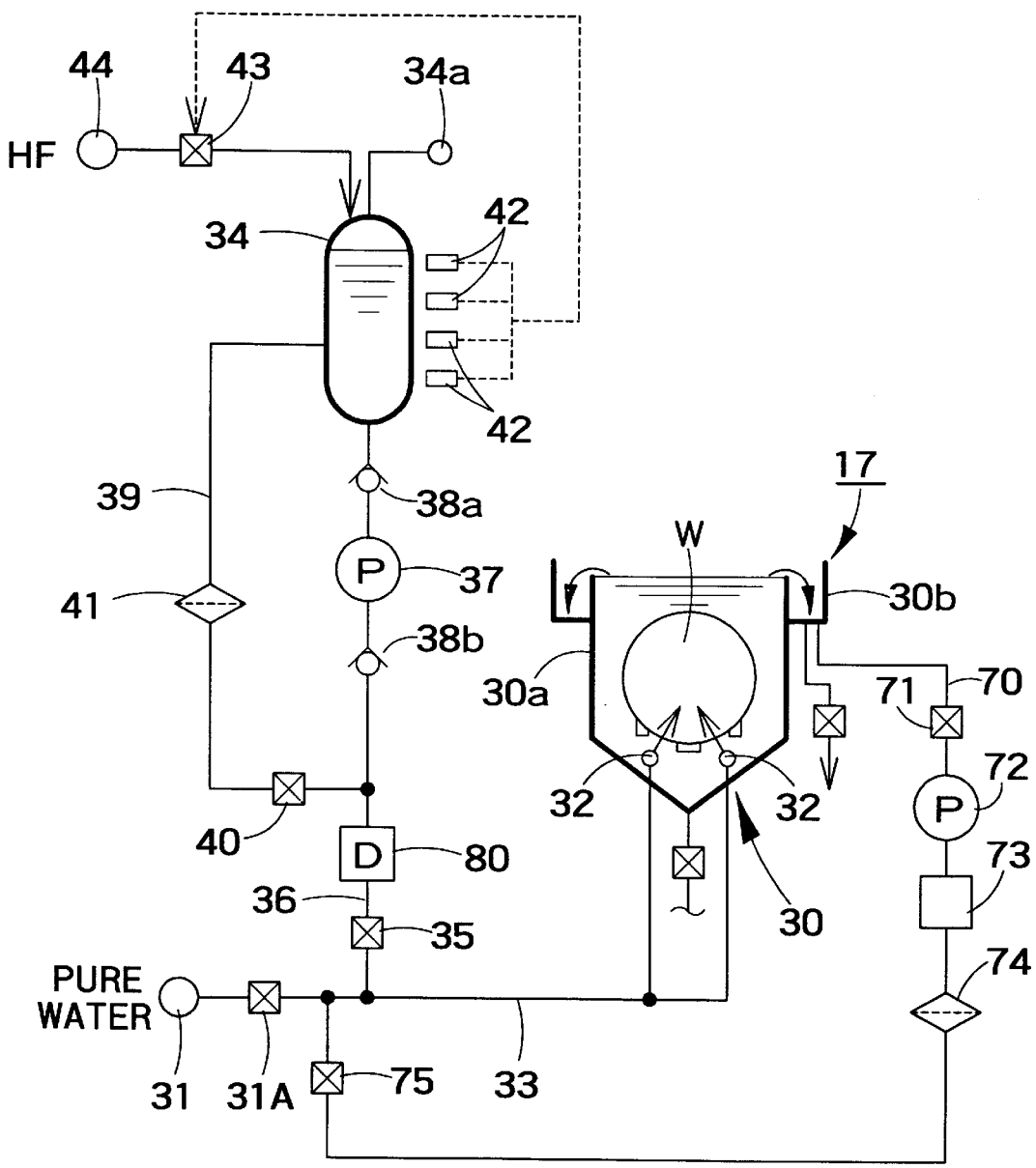
FIG. 9 is a schematic sectional view of a treatment apparatus according to a sixth embodiment of the invention.

FIG. 9 is a general schematic view of a treatment apparatus according to a sixth embodiment of the invention.

The sixth embodiment is a version for saving the consumption of the chemical liquid and for efficient use of the chemical liquid. An outlet opening formed at the bottom of an outer tank 30b of the cleaning tank 30 is connected to the cleaning liquid supply nozzle 32 (cleaning liquid supply portion) located within the cleaning tank 30 through a circulating conduit 70 in which a first open/close valve 71, a circulating pump 72, a temperature adjusting mechanism 73, a filter 74 and a second open/close valve 75 are interposed, so that the chemical liquid, DHF, for example, stored in the cleaning tank 30 be circularly supplied for removing metallic contaminants or oxide films from the surfaces of wafers W.

In the other respects, the sixth embodiment is the same as the first embodiment. Therefore, the same elements are labeled with common reference numerals, and their explanation is omitted here.

In the treatment apparatus having the above-explained construction, after metallic contaminants or oxide films are removed from the surfaces of wafers W contained in the cleaning tank 30 by an overflow of DHF or other chemical liquid stored in the cleaning tank 30, the open/close valve 31A is closed to stop the supply of pure water, and the infusion open/close switching valve 35 is closed. Then, by opening the first and second open/close valves 71, 75, and driving the circulating pump 72, DHF stored in the cleaning tank 30 is circulated while being adjusted in temperature by the temperature adjusting mechanism 73, filtered by the filter 74, and used for removing metallic contaminants or oxide films from the surfaces of wafers immersed into DHF.

After the treatment by the chemical liquid in this manner, the first and second open/close valves 71, 75, are closed and the open/close valve 31A is opened to open the channel between the pure water supply source 31 and the cleaning tank 30. By holding the infusion open/close switching valve 35 closed, pure water is supplied to the cleaning tank 30 to replace DHF. Then, wafers W are immersed into pure water, and the chemical liquid, i.e. HF, is removed from wafers W by an overflow of the pure water.

In the process of cleaning wafers W in the cleaning tank 30 by an overflow of pure water, thereafter cleaning wafers W by an overflow of the chemical liquid diluted into a predetermined concentration, i.e. DHF, in pure water continuously supplied into the cleaning tank 30, subsequently stopping the supply of DHF, circulating DHF stored in the cleaning tank 30 while adjusting its temperature, filtering it, and using it for cleaning, and again cleaning wafers W in the cleaning tank 30 to remove HF therefrom by an overflow of pure water, the uniformity along the plane of each wafer W once degrades upon replacement of pure water by DHF, but the uniformity is recovered upon replacement of DHF by pure water. Therefore, a high etching uniformity is ensured, and the cleaning efficiency is improved. Moreover, since the chemical liquid, e.g. DHF, stored in the cleaning tank 30 is circularly used while being adjusted in temperature and filtered, DHF can be decreased in consumption and used efficiently.

Seventh Embodiment

Figure 10:
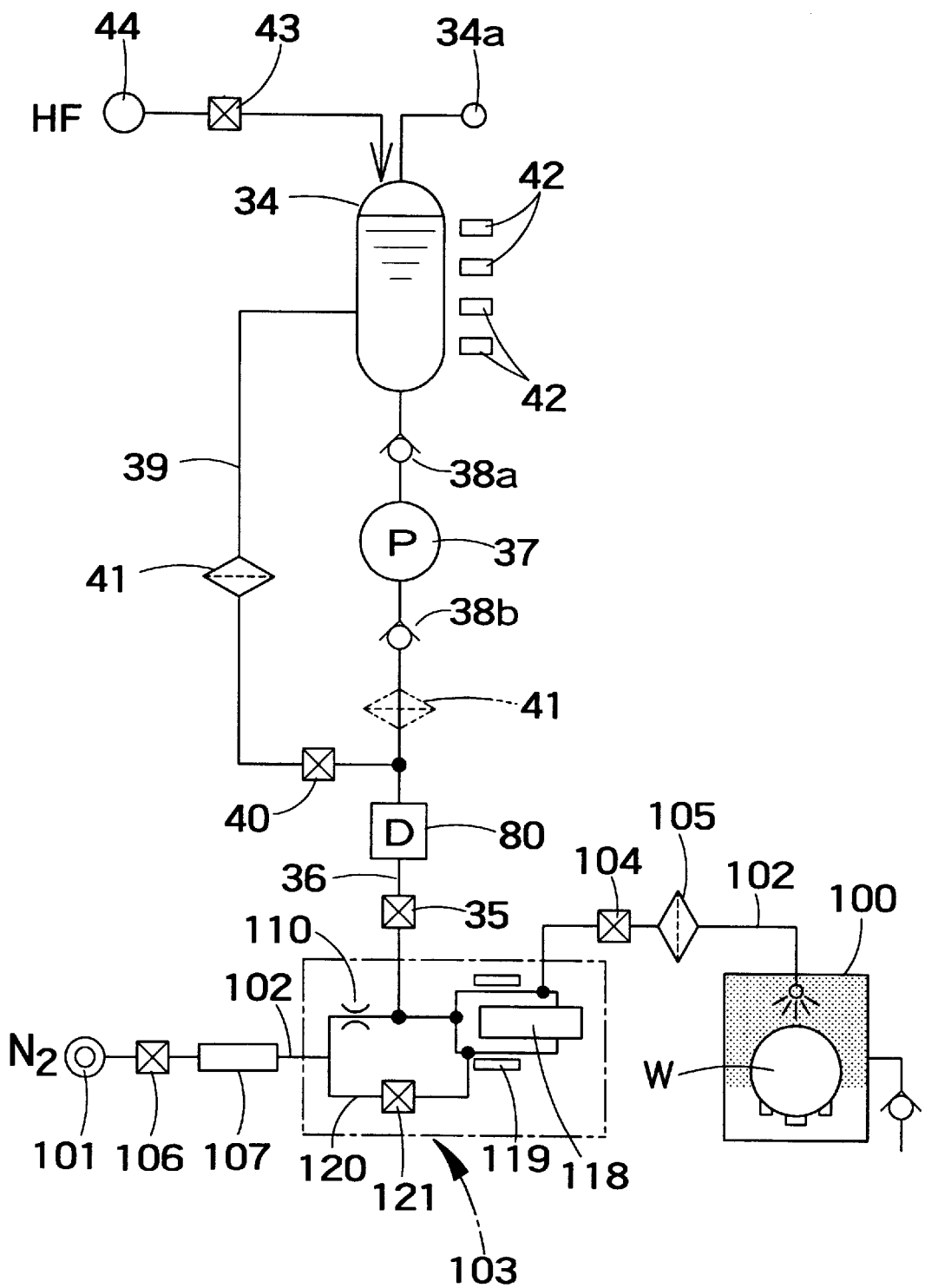
FIG. 10 is a schematic sectional view of a treatment apparatus according to a seventh embodiment of the invention.

FIG. 10 is a general sectional view schematically showing a treatment apparatus according to a seventh embodiment of the invention.

The seventh embodiment is a version applied to a drying treatment unit 21.

In this case, the treatment apparatus includes a drying treatment section, such as drying vessel 100, for drying wafers W by blowing onto the wafers, after the cleaning treatment, a drying gas in form of a mixed gas containing vapor of a chemical liquid, such as IPA (isopropyl alcohol) or other organic solvent, and a drying gas carrier gas, such as $N_2$ gas; a drying gas carrier gas supply source, such as $N_2$ gas supply source, 101 connected to the drying vessel 100; a drying gas generator 103 interposed in a $N_2$ gas supply pipe 102 connecting the drying vessel 100 and the $N_2$ gas supply source 101; a chemical liquid container 34 storing a chemical liquid such as IPA; and a chemical liquid supply pipe 36 connecting the drying gas generator 103 to the chemical liquid container 34 via an infusion open/close switching valve 35. The chemical liquid supply pipe 36 includes the same reciprocal pump 37 as used in the first embodiment interposed in the chemical liquid supply pipe 36. Also, an open/close valve 104 and a filter 105 are interposed in the N₂ gas supply pipe 102 in locations extending from the outlet of the drying gas generator 103, and an open/close valve 106 and a N₂ gas heater 107 are interposed sequentially in the N₂ gas supply pipe 102 in locations extending from the N₂ gas supply source 101.

Figure 11:
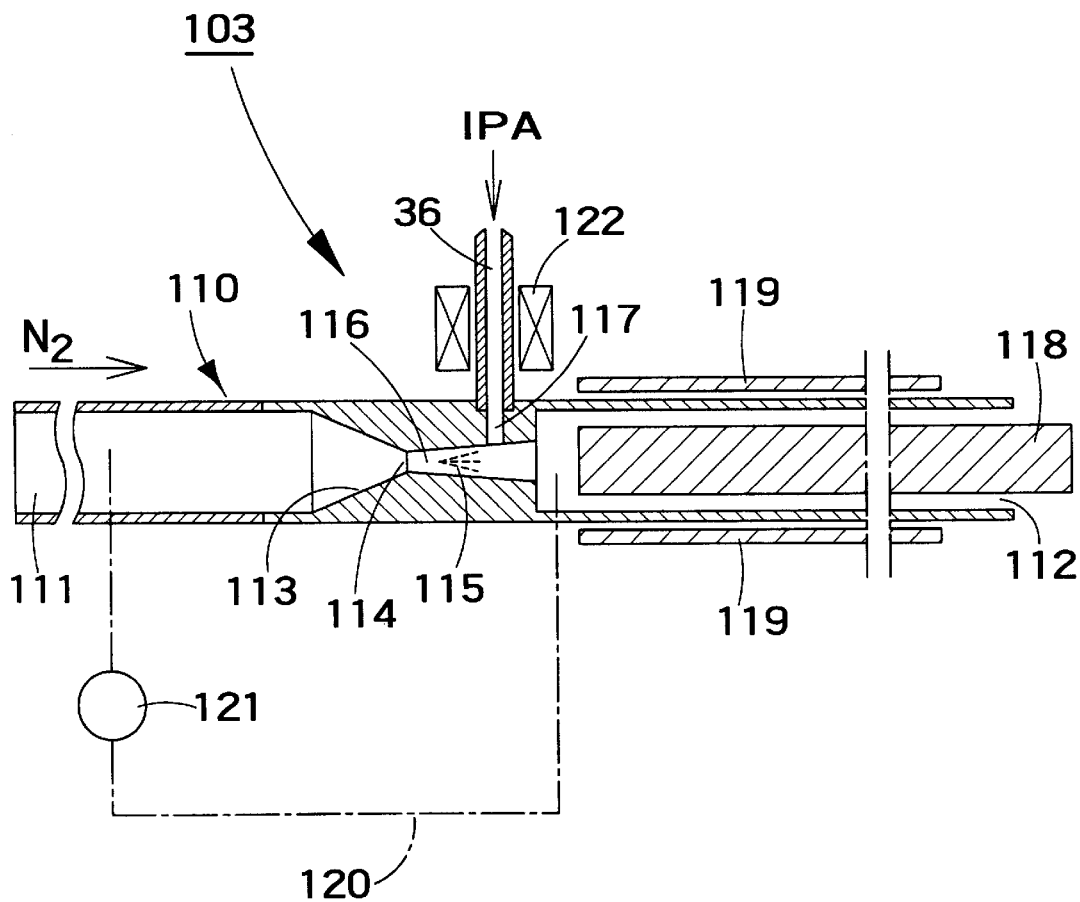
FIG. 11 is a schematic sectional view of a drying gas generator in a seventh embodiment of the invention.

With reference to FIG. 11, the drying gas generator 103 has a pipe-shaped medium-thickness nozzle 110 made of a stainless steel, for example, and having an inlet 111 and an outlet 112 connected to the supply pipe 102 for N₂ gas as a gas for the vapor medium. The medium-thickness nozzle 110 defines, thereon a converging nozzle portion 113 gradually decreasing in diameter in the flowing direction of N₂ gas, and a diverging nozzle portion 115 gradually increasing in diameter from the narrowest portion (throat portion) 114 of the converging nozzle portion 113 in the flowing direction, and has formed an impulse wave creating portion 116 in a location adjacent to the throat portion 114 nearer to the outlet side (secondary side).

Additionally, an IPA supply opening 117 for supplying IPA as a liquid to be vaporized is formed in the diverging nozzle portion 115 near the throat portion 114 of the medium-thickness nozzle 110. Connected to the supply opening 117 is the chemical liquid container 34 via the chemical liquid supply pipe 36. An inner cylindrical heater 118 as a first heater is interposed within the medium-thickness nozzle 110 nearer to the outlet 112 of the diverging nozzle portion 115, and an outer cylindrical heater 119 as a second heater is provided to surround the inner cylindrical heater 118, to perform two or more steps of heating function in the flowing direction. That is, they are arranged to make dense to thin transition in heating power along the flowing direction of N₂ gas. In this case, heaters may be provided near the impulse wave creating portion 116 and the IPA supply opening 117.

A branch path 120 is provided to extend from a portion before the inlet 111 to a portion after the outlet 112 of the medium-thickness nozzle 110, and a pressure adjusting valve 121 is interposed in the branch path 120 to cope with fluctuations in pressure of N₂ gas supplied to the medium-thickness nozzle 110 by adjustment of the pressure adjusting valve 121. More specifically, since the orifice diameter of the medium-thickness nozzle 110 is fixed and not variable, if an upper limit pressure is applied to the primary side (inlet side) of the medium-thickness nozzle 110, an upper limit is inevitably determined also for the flow rate of N₂ gas running through the medium-thickness nozzle 110. However, if a larger flow rate of N₂ gas is desired depending upon process conditions, the apparatus can afford to be available for any flow rate within a wider range by using the branch path 120 to introduce an additional quantity of N₂ gas into the downstream side (outlet side) of he medium-thickness nozzle 110. In this case, the additional quantity of N₂ gas can be adjusted by the pressure adjusting valve 121 interposed in the branch path 120. Moreover, by adjusting the pressure adjusting valve 121, conditions for producing an impulse wave can be determined appropriately.

A cooling means 122 is interposed in the chemical liquid supply pipe 36 near the IPA supply opening 117. The cooling means 122 may be configured, for example, to circularly supply a refrigerant to a jacket surrounding the chemical liquid supply pipe 36, and to cool IPA flowing through the chemical liquid supply pipe 36 below its boiling point. By cooling IPA to a value below its boiling point by the cooling means 122, vaporization of IPA by heat from the heating means, i.e. the inner cylindrical heater 118 and the outer cylindrical heater 119, and IPA in the liquid form can be supplied reliably through the supply opening 117 of the medium-thickness nozzle 110, even when a slight amount of IPA is supplied.

In the construction explained above, when N₂ gas as a gas for the vapor medium flows from the inlet toward the outlet of the medium-thickness nozzle 110, N₂ gas is accelerated in the convergent nozzle portion 113. The speed reaches the sonic velocity at the throat portion 114. Even after the gas enters into the divergent nozzle portion 115, it is further expanded and increased in velocity to make an ultrasonic flow, and jets out at a ultrasonic velocity. As a result, an impulse wave is produced. When IPA is supplied from the supply opening 117 under the condition, a sudden impulse wave is generated, and the energy of the impulse wave atomizes IPA. By heating the atomized IPA with the inner cylindrical heater 118 and the outer cylindrical heater 119, IPA gas (vapor) is created. In this process, if the inner cylindrical heater 118 and the outer cylindrical heater 119 make at least two stages of heating power along the flowing direction of N₂ gas to vary the heating power in dense (large) to thin (small) transition, the temperature balance of the inner cylindrical heater 118 and the outer cylindrical heater 119 can be adjusted to elongate the life of the heaters 55, 56.

The treatment apparatus having the above-explained construction can infuse a predetermined quantity of the chemical liquid, such as IPA, into the drying gas generator 103 to mix it with N₂ gas and can generate the drying gas of a predetermined concentration by driving the reciprocal pump 37 as explained above while the open/close valve 106 and the infusion open/close switching valve 35 are open. Then, by blowing the generated drying gas onto wafers W contained in the drying vessel 100, vapor of the drying gas is condensed or adsorbed to remove moisture from wafers W and to dry the wafers.

In the seventh embodiment, the reciprocal pump 37 as a positive displacement pump may be any of the pumps used in the first to fifth embodiments. In the other respects, the seventh embodiment is the same as the first embodiment. Therefore, the same elements are labeled with common reference numerals, and their explanation is omitted here.

Other Embodiments

Although the first to sixth embodiments have been described as applied to the third treatment unit 17, the invention, needless to say, is applicable also to the first or second treatment unit 19, 18.

The foregoing embodiments have been explained with respect to the treatment apparatus and cleaning treatment method applied to cleaning treatment systems for cleaning semiconductor wafers; however, the invention is applicable also to treatment of LCD glass substrates, or the like, instead of semiconductor wafers.

As described above, the invention can ensures that a predetermined quantity of a chemical liquid be reliably infused into pure water independently of fluctuations in flow rate or pressure of pure water flowing through the supply pipe to supply the chemical liquid of a predetermined concentration into the cleaning tank. Therefore, it improves the cleaning efficiency and the production yield.

What is claimed is:

1. A treatment apparatus comprising:

a treatment section that stores a cleaning liquid for cleaning a surface of an object to be treated;

a pure water supply source;

a pure water supply pipe connecting said pure water supply source and said treatment section;

a chemical liquid container that stores a chemical liquid;

a chemical liquid supply pipe connecting said chemical liquid container and said pure water supply pipe;

open/closing switching means provided in said chemical liquid supply pipe;

a pneumatically operated, reciprocally driven pump provided in said chemical liquid supply pipe and having a reciprocating diaphragm therein;

a driving air source for supplying a driving air;

a driving air supply pipe connecting said driving air source to said pneumatically operated, reciprocally driven pump to supply the driving air to the pump to operate said diaphragm;

an air pressure regulator provided in said driving air supply pipe;

a passage switching valve provided in said driving air supply pipe, said passage switching valve being movable between a position in which said driving air is supplied to said pump and another position in which the driving air in said pump is allowed to be discharged; and a control unit, said control unit further comprising:

a processor; and a sequencer, said sequencer receives from said processor a chemical-liquid-discharge-quantity-selection signal, and a chemical-liquid-discharge-operation signal, said sequencer supplying an instruction signal to said passage switching valve to control a switching speed of said passage switching valve in such manner that a predetermined pressure of said driving air is supplied to said pump, whereby the chemical liquid of a predetermined quantity is supplied by the pump.

2. The treatment apparatus according to claim 1, wherein said pump is a diaphragm pump.

3. The treatment apparatus according to claim 1, further comprising:

a circulation conduit connecting a delivery side of said chemical liquid feed means and said chemical liquid container;

an open/close valve provided in said circulation conduit; and a filter provided in said circulation conduit.

4. A treatment apparatus comprising:

a treatment section that stores a cleaning liquid for cleaning a surface of an object to be treated;

a pure water supply source;

a pure water supply pipe connecting said pure water supply source and said treatment section;

a chemical liquid container that stores a chemical liquid;

a chemical liquid supply pipe connecting said chemical liquid container and said pure water supply pipe;

open/close switching means provided in said chemical liquid supply pipe;

a pneumatically operated, reciprocally driven pump provided in said chemical liquid supply pipe;

a pressure detecting sensor provided in said chemical liquid supply pipe on a delivery side of said pump to issue a chemical-liquid-pressure signal;

a driving air source for supplying a driving air;

a driving air supply pipe connecting said driving air source to said pneumatically operated, reciprocally driven pump to supply the driving air to the pump;

an air pressure regulator provided in said driving air supply pipe;

a passage switching valve provided in said driving air supply pipe, said passage switching valve being movable between a position in which said driving air is supplied to said pump and another position in which the driving air in said pump is allowed to be discharged; and a control unit that receives said chemical-liquid-pressure signal from said pressure detecting sensor and compares the chemical-liquid-pressure signal with a predetermined control information stored in said control unit in order to output a chemical-liquid-discharge-quantity-selection signal and a chemical-liquid-discharge-operation signal, said control unit further comprises a sequencer that receives said chemical-liquid-discharge-quantity-selection signal and said chemical-liquid-discharge-operation signal in order to control a switching operation of said passage switching valve.

* * * * *